US006530071B1

(12) United States Patent
Guccione et al.

(10) Patent No.: US 6,530,071 B1
(45) Date of Patent: Mar. 4, 2003

(54) METHOD AND APPARATUS FOR TOLERATING DEFECTS IN A PROGRAMMABLE LOGIC DEVICE USING RUNTIME PARAMETERIZABLE CORES

(75) Inventors: Steven A. Guccione, Austin, TX (US); Prasanna Sundararajan, Campbell, CA (US)

(73) Assignee: Xilinx, Inc., San Jose, CA (US)

( * ) Notice: Subject to any disclaimer, the term of this patent is extended or adjusted under 35 U.S.C. 154(b) by 183 days.

(21) Appl. No.: 09/676,298

(22) Filed: Sep. 28, 2000

(51) Int. Cl.[7] .............................................. G06F 17/50
(52) U.S. Cl. ............................ 716/17; 716/16; 716/17; 716/18
(58) Field of Search ........................... 716/1–4, 16–18, 716/8, 10–12; 714/725; 326/38, 41

(56) References Cited

U.S. PATENT DOCUMENTS

| 4,845,633 A | * | 7/1989 | Furtek .......................... 326/38 |
| 5,946,219 A | * | 8/1999 | Mason et al. .................. 716/16 |
| 6,078,736 A | | 6/2000 | Guccione |

OTHER PUBLICATIONS

John M. Emmert, Dinesh Bhatia; "Incremental Routing in FPGAs"; ASIC Conference 1998; Eleventh Annual IEEE International Proceedings; Rochester, NY; Sep. 13–16, 1998; pp. 217–221.

Vijay Kumar, Anton Dahbura, Fred Fischer, Patrick Juola; "An Approach for the Yield Enhancement of Programmable Gate Arrays"; 1989 International Conference on Computer–Aided Design; Nov. 5, 1989; pp. 226–229.

Steven A. Guccione, Delon Levi; "Run–Time Parameterizable Cores"; Field Programmable Logic and Applications (9th International WKSP); Aug. 30, 1999; pp. 215–222.

Emmert et al., "Dynamic Fault Tolerance in FPGAs via Partial Reconfiguration", IEEE Symposium on Field–Programamble Custom Computing Machines, Apr. 17–19, 2000, Preliminary Proceedings, pp. 1–10.

* cited by examiner

Primary Examiner—Vuthe Siek
Assistant Examiner—Naum Levin
(74) Attorney, Agent, or Firm—LeRoy D. Maunu Crawford PLLC

(57) ABSTRACT

Method and apparatus for tolerating defects in a programmable logic device (PLD). A PLD includes a plurality of configurable logic elements and interconnect resources, wherein one or more of the configurable logic elements and interconnect resources have circuit defects. A design program is executed that is suitable for run-time reconfiguration of the PLD. The design program includes executable code that specifies a circuit design and generates a configuration bitstream that implements the circuit design on the programmable logic device. The design program also includes code that selectively skips the configurable logic elements and interconnect resources that contain the defects. In various embodiments, an individual configurable logic element, an entire row, or an entire column of elements can be skipped responsive to an input parameter.

16 Claims, 4 Drawing Sheets

METHOD AND APPARATUS FOR TOLERATING DEFECTS IN A PROGRAMMABLE LOGIC DEVICE USING RUNTIME PARAMETERIZABLE CORES

RELATED PATENTS/APPLICATIONS

This patent application is related to the following co-pending, commonly owned application:

"RUN-TIME ROUTING FOR PROGRAMMABLE LOGIC DEVICES," filed on Feb. 9, 2000 by Eric R. Keller et al. and having application Ser. No. 09/501,356.

The contents of the above application are incorporated herein by reference.

GOVERNMENT CONTRACT

The U.S. Government has a paid-up license in this invention and the right in limited circumstances to require the patent owner to license others on reasonable terms as provided for by the terms of DABT63-99-3-0004 awarded by DARPA.

FIELD OF THE INVENTION

The present invention generally relates to configuration of programmable logic devices, and more particularly to addressing defects in programmable logic devices using runtime parameterizable logic cores.

BACKGROUND

Field programmable gate arrays (FPGAs), first introduced by Xilinx in 1985, are becoming increasingly popular devices for use in electronics systems. For example, communications systems employ FPGAs in large measure for their re-programmability and high speed. In general, the use of FPGAs continues to grow at a rapid rate because they permit relatively short design cycles, reduce costs through logic consolidation, and offer flexibility in their re-programmability.

As with most semiconductor devices, the size of FPGAs is limited by the quality of the manufacturing process. Because there are typically a number of flaws distributed across a wafer, the manufacturing yield for larger devices is much less than the yield for smaller devices. Thus, larger devices tend to be very expensive. While advances in manufacturing technology has increased yields for both large and small devices, yields can be further enhanced using techniques for tolerating manufacturing defects. The ability to tolerate defects in semiconductor devices has the potential for both increasing manufacturing yields and increasing the feasibility of manufacturing larger devices.

Hardware and software approaches have been suggested for tolerating defects in semiconductor devices. For example, one hardware approach uses redundant circuitry to make "spare parts" available on the device. However, providing redundant circuitry increases the device size, thereby reducing yields.

The software approach maps circuitry around defective areas of the device. One disadvantage to the software approach is that the software is typically computationally intensive, and the software would have to be rerun on the design for each device in order to map around defects.

Defect tolerance techniques for FPGAs have been explored, but the techniques have not been widely adopted. Since testing devices is expensive and there is a lack of suitable software for tolerating defects, an FPGA is usually discarded when the first defect is encountered in testing the FPGA.

An example run-time approach to defect tolerance is described in "Dynamic fault tolerance in FPGAs via partial reconfiguration," by Emmert et al., IEEE Symposium on Field-Programmable Custom Computing Machines, April 2000. This paper describes a technique for automatically detecting faults in an operating FPGA circuit and reconfiguring the circuit around any detected defects. This approach addresses the problems associated with long runtimes of tools by bypassing the design tools. A circuit is remapped incrementally at the device level by keeping spare device resources available at design time. Emmert's approach does not provide control to the designer over the remapping process.

A system and method that address the aforementioned problems, as well as other related problems, are therefore desirable.

SUMMARY OF THE INVENTION

In various embodiments, a method and apparatus are provided for tolerating defects in a programmable logic device (PLD). A PLD generally includes a plurality of configurable logic elements and interconnect resources. If one or more of the configurable logic elements and resources have circuit defects, the PLD may still provide a workable circuit with use of the present invention.

In the various embodiments of the invention defect tolerance is addressed at the logic core/application level. A design program is executed that includes executable code that both specifies a circuit design and generates a configuration bitstream that implements the circuit design on the programmable logic device. The design program also includes code that selectively skips the configurable logic elements and resources that contain the defects. In various embodiments, an individual configurable logic element, an entire row, or an entire column of elements can be skipped responsive to an input parameter from the designer. Thus, a designer can control how the design is implemented when defects are encountered, and a defect tolerant implementation can be generated quickly. This supports defect tolerance in a production environment, an in-system reconfiguration application, as well as a run-time reconfiguration application.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which:

FIGS. 3A–C are block diagrams that illustrate a subset of configurable logic elements of a PLD and the three modes of constructing a runtime parameterizable logic core in the presence of a defective configurable logic element.

DETAILED DESCRIPTION

Various embodiments of the present invention are described in terms of extensions to JBits software from Xilinx for Xilinx FPGAS. While the invention is not limited in scope to JBits, the various embodiments will be presented in terms of specific examples involving the JBits programming environment. Those skilled in the art will appreciate that the invention could be implemented in other programming languages, applied to programmable logic devices (PLDs) other than FPGAs, or adapted to applications that are not run-time reconfigurable.

Figure 1:
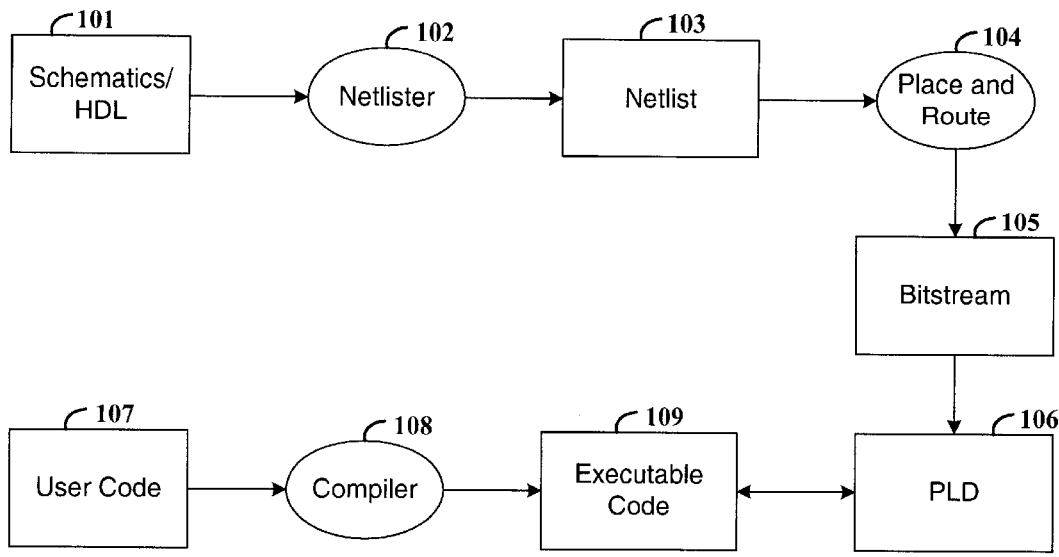
FIG. 1 is a functional block diagram of a design path for implementing a circuit on a programmable logic device (PLD)

Design of a circuit implemented in a PLD using a reconfigurable logic coprocessor currently requires a combination of two distinct design paths, as shown in FIG. 1. The first and perhaps most significant portion of the effort involves circuit design using traditional CAD tools. The design path for these CAD tools typically comprises entering a design 101 using a schematic editor or hardware description language (HDL), using a netlister 102 to generate a net list 103 for the design, importing this netlist into an placement and routing tool 104, and after placing and routing the design, a bitstream generation tool (not shown) generates a bitstream file 105 of configuration data used to configure the programmable logic device (PLD) 106.

Once the configuration data has been produced, the next task is to provide software to interface the processor to the PLD. The user enters user code 107 describing the user interface instructions, which is then compiled using compiler 108 to produce executable code 109. The instructions in executable code 109 are then used by the processor to communicate with the configured PLD 106. It is also known to use executable code 109 to control the configuration of PLD 106 with bitstream file 105. This series of tasks is usually completely decoupled from the task of designing the circuit and hence can be difficult and error-prone.

In addition to the problems of interfacing the hardware and software in this environment, there is also the problem of design cycle time. Any change to the circuit design requires a complete pass through the hardware design tool chain (101–106 in FIG. 1). This process is time consuming, with the place and route portion of the chain typically taking several hours to complete.

Finally, this approach provides no support for run-time reconfiguration. The traditional hardware design tools provide support almost exclusively for static design. It is difficult to imagine constructs to support run-time reconfiguration in environments based on schematic or HDL design entry.

Figure 2:
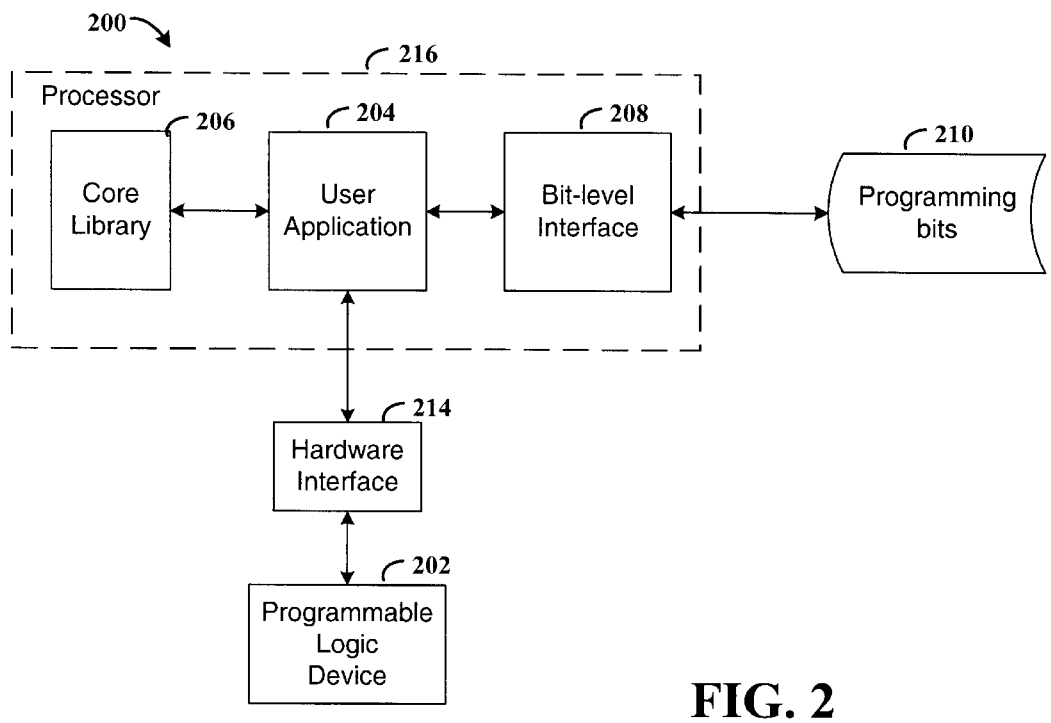
FIG. 2 is a block diagram of a system 200 for run-time configuration and reconfiguration of a programmable logic device.

FIG. 2 is a block diagram of a system 200 for run-time configuration and reconfiguration of a programmable logic device 202. System 200 includes a user application program 204 that is written in the Java® language, for example. The application program 204 may be written to perform various functions relative to the environment in which system 200 is used. For example, in addition to configuration and/or run-time reconfiguration of programmable logic device 202, the user application program 204 may be programmed to provide user-interface functions and/or digital signal processing.

Core library 206 is a collection of macrocell or "core" generators that are implemented as Java classes. Each core generates configuration bits that implement a particular circuit on an FPGA. The cores are generally parameterizable and relocatable within a device. Examples of cores include counters, adders, multipliers, constant adders, constant multipliers, flip-flops and other standard logic and computation functions. The JBits environment from Xilinx, for example, includes a library of logic cores.

Bit-level interface 208 includes an application program interface that allows the user application program 204 to manipulate configurable resources of programmable logic device 202. The bit-level interface also includes a set of functions, one or more of which are invoked when the user application program 204 references the application program interface. The set of functions in the bit-level interface manipulate selected programming bits 210, based on the type of programmable logic device. For example, some of the functions in the set may be programmed for certain devices in the XC4000EX family of FPGAs from Xilinx, and others of the functions may programmed for other devices in the XC4000XL family. Bit-level interface software is generally understood by those skilled in the art. For example, JBits software is available for use with Virtex series FPGAs from Xilinx.

The programming bits may be stored in a storage element (not shown), such as a magnetic or optical disk or an electronic memory.

While core library 206, user application 204, and bit-level interface 208 are written in Java in the example embodiment, it will be appreciated that many other languages would also be suitable.

Hardware interface 214 includes a portable layer of software and accompanying hardware to couple application program 204 to programmable logic device 202. For example, hardware interface 214 may be the Xilinx Hardware Interface (XHWIF) which is available from Xilinx.

Processor 216 is coupled to programmable logic device 202 via hardware interface 214. The functional requirements of system 200 dictate the particular style and capabilities of processor 216. For example, some applications may call for a RISC based processor while others may call for a CISC. Various ones of special purpose or general purpose processors from manufacturers such as Intel, Sun Microsystems, Motorola, IBM, AMD and others may be suitable.

Unlike static circuit designs, for example, schematic capture or HDL logic cores, JBits logic cores are not fixed. JBits logic cores are code sequences that describe how to implement a circuit. This permits a high degree of flexibility in how circuits are instantiated in the configuration bitstream. For example, parameters such as bit width can be specified as late as at run-time. A core that takes as input a parameter that influences instantiation of the core at runtime is referred to as a "runtime parameterizable core" (RTP core). RTP cores not only simplify library design and provide a wider range of choices for designers, they allow circuits to be modified and configured in-system at runtime, for example, in response to user input or sensor data. RTP cores provide a useful framework for tolerating hardware defects.

Existing software-based approaches for defect tolerance in PLDs tend to operate at the device level, globally view resources, and generally operate autonomously. In various embodiments of the present invention, working at the core level allows the designer to control the core layout when defects are encountered. This can have a significant impact on the final circuit.

In one embodiment, the RTP core approach can be adapted to tolerate PLD defects that have been detected and identified, for example, either during the manufacturing process or in the field. For example, the JBits code that defines an RTP core can also be programmed to skip defective PLD logic elements and interconnect resources. Since RTP cores operate at the level of a configurable logic element (e.g., a configurable logic block of a Xilinx FPGA), defect tolerance in an RTP core may also operate at the configurable logic element level. Thus, when a circuit element (e.g., flip-flop, multiplexer, etc.) within a configurable logic element is found to be defective, the entire configurable logic element is marked as unusable. A list is used to track defective configurable logic elements in one embodiment.

By implementing defect tolerance at the RTP core level, defect tolerance can be tailored to the specific needs of individual logic cores. That is, a single approach to defect tolerance is not required for all cores. Each RTP core can use an approach that is suitable for the particular circuit or mode of operation.

In one embodiment, three modes are provided for constructing an RTP core in the presence of a defective configurable logic element. The three modes include skipping the defective configurable logic element, skipping a row of configurable logic elements in which one or more of the configurable logic elements is defective, and skipping a column of configurable logic elements in which one or more of the configurable logic elements is defective.

Figures 3A, 3B:
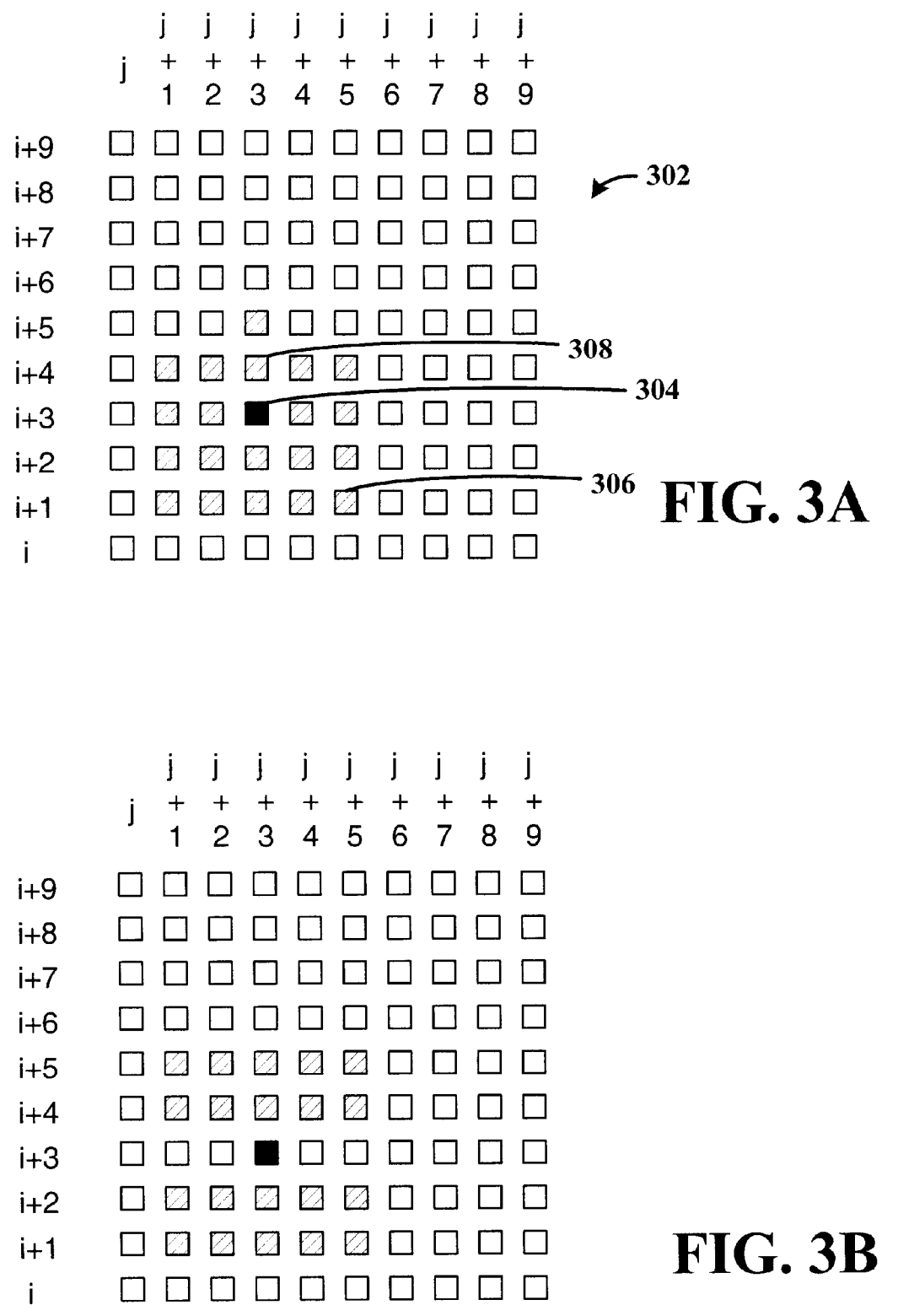
Figure 3C:
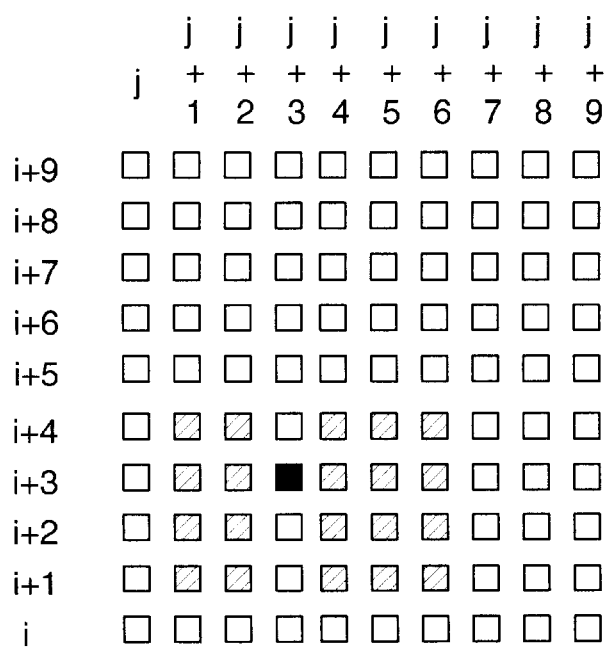

FIGS. 3A–C are block diagrams that illustrate a subset of configurable logic elements of a PLD and the three modes of constructing an RTP core in the presence of a defective configurable logic element. The rows of the PLD are labeled i–i+9, and the columns are labeled j–j+9. The defective configurable logic element is solid black block 304. The shaded blocks, for example, block 306, represent configurable logic elements that are configured to implement a logic core. While FIGS. 3A–C illustrate configurable logic elements, it will be appreciated that an RTP core designed in accordance with the teaching of the present invention would manipulate bits in a configuration bitstream for configuring the illustrated configurable logic elements rather than directly manipulating the configurable logic elements on the device.

FIG. 3A illustrates the first mode of constructing an RTP core in the presence of a defective configurable logic element. In the first mode ("skip-single" mode), a single configurable logic element is skipped when constructing the RTP core. The configurable logic elements of a PLD are configured in the direction of the bottom row toward the top row and from the left column toward the right column in an example RTP core. Thus, for example, the configurable logic element at row i+1, column j+1 is configured first, followed by the other configurable logic elements in column j+1.

When the defective configurable logic element 304 is encountered while processing in skip-single mode, an alternative configurable logic element is selected for implementing the circuitry of the logic core. For example, configurable logic element 308 is selected in place of configurable logic element 304.

FIG. 3B illustrates the second mode ("skip-row" mode) of constructing an RTP core in the presence of a defective configurable logic element. In the skip-row mode, a row of configurable logic elements is skipped when constructing the RTP core when one or more of the configurable logic elements in the row is defective. When row i+3 is encountered in constructing the RTP logic core, the RTP core checks whether there are any defective configurable logic elements in the row. If any are defective, all the configurable logic elements in the row are marked as unusable. Thus, logic that ordinarily would occupy configurable logic elements in row i+3 at columns j+1–j+5 are alternatively implemented in row i+4.

FIG. 3C illustrates the third mode ("skip-column" mode) of constructing an RTP core in the presence of a defective configurable logic element. In the skip-column mode, a column of configurable logic elements is skipped when constructing the RTP core when one or more of the configurable logic elements in the column is defective. When column j+3 is encountered in constructing the RTP logic core, the RTP core checks whether there are any defective configurable logic elements in the column. If any are defective, all the configurable logic elements in the column are marked as unusable. Thus, logic that ordinarily would occupy configurable logic elements in column j+3 at rows i+1–i+5 are alternatively implemented in column j+4.

Figure 4:
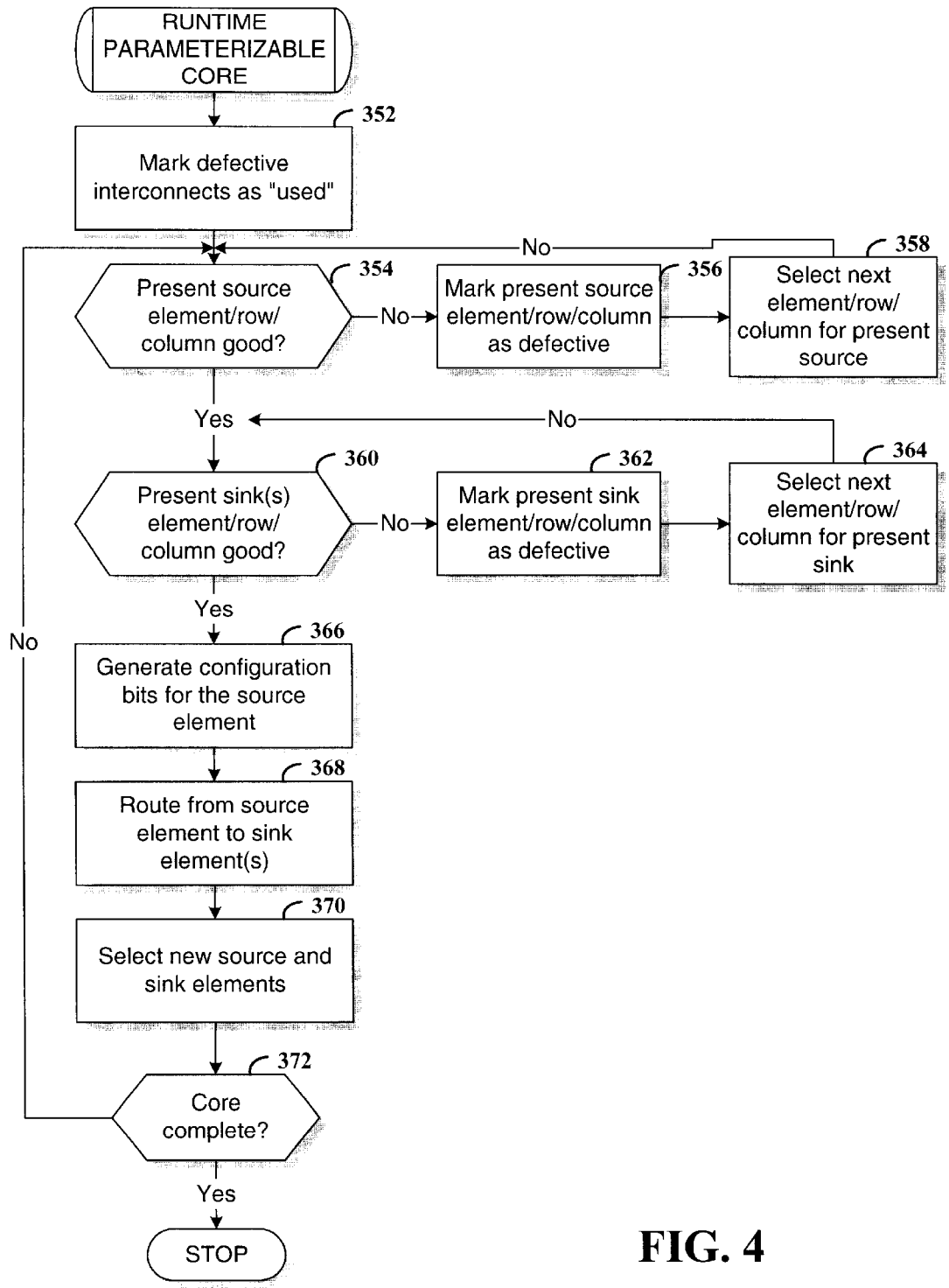
FIG. 4 is a flowchart of a process for constructing a runtime parameterizable logic core in a configuration bitstream in accordance with one embodiment of the invention.

FIG. 4 is a flowchart of a process for constructing a runtime parameterizable logic core in a configuration bitstream in accordance with one embodiment of the invention. While RTP cores may incorporate other RTP cores in a hierarchical fashion, the higher level cores need not address defective configurable logic elements. Only the lowest level RTP cores, which are constructed using arrays of configurable logic elements, need to be programmed to address defective configurable logic elements. The lowest level cores generally take input parameters that specify location and size of the core to be constructed. For example for a shift register, the location parameters indicates the row and column, and the size may be the number of bits in the shift register. Since the low level cores directly program device resources, the higher level cores need not address defect tolerance as long as all of the lower level cores in use do so.

In addition to the size and location parameters, a skip-mode parameter is input to the RTP core. The value of the skip-mode parameter designates whether the RTP core should skip a single configurable logic element (skip-single), skip a row (skip-row) of configurable logic elements, or skip a column (skip-column) of configurable logic elements when a defective configurable logic element is encountered.

At step 352, the interconnect resources of the PLD that are defective are marked as "used." In one embodiment, data objects are associated with the various interconnect resources and configurable logic elements of the PLD. The data objects store respective status information, for example, "used" or "defective." Since there are many interconnect resources, for example, hundreds per configurable logic element, the interconnect resources are more likely to have the defects. Rather than mark an entire configurable logic element as bad, the routing database (not shown) is modified to mark the defective interconnect resources as used. The routing database keeps track of which interconnect resources are in use in the design. Defective interconnect resources are viewed as being used so that subsequent configurations will not try to use the resource.

A configurable logic element is not marked bad if it only has bad interconnect resources. A configurable logic element is marked bad only if there is a defective circuit element in the configurable logic element, for example, a look-up table, flip-flop, or multiplexer. Thus, a defective configurable logic element can be used even if it has a defective interconnect resource.

In generating bits for the configuration bitstream, an RTP core generally generates configuration bits for a configurable logic element and then generates bits for connecting ("routing") the output pin(s) ("source(s)") of the configurable logic element to one or more input pin(s) ("sink(s)") of other configurable logic elements. In the rest of the discussion, the configurable logic element having the source pins is referred to as the source configurable logic element, and the configurable logic element having the sink pins is referred to as the sink configurable logic element. Similarly, the configuration bits are generated for the next configurable logic element in the subsequent iteration.

At decision step 354, a source configurable logic element is in process. Decision step 354 performs a mode-dependent test related to the defective configurable logic elements. In particular, if the value of skip-mode parameter specifies skip-single mode and the in-process source configurable logic element is defective, then the process is directed to step 356. If the value of the skip-mode parameter specifies skip-row mode and if any of the configurable logic elements in the row occupied by the in-process source configurable logic element are defective, then control is directed to step 356. Similarly, if the value of the skip-mode parameter specifies skip-column mode and if any of the configurable logic elements in the column occupied by the in-process source configurable logic element are defective, then control is directed to step 356.

At step 356, the appropriate configurable logic element(s) are marked as defective. The skip-mode parameter dictates which elements are marked. A single configurable logic element is marked defective for the skip-single mode, a row of configurable logic elements are marked defective for the skip-row mode, and a column of configurable logic elements are marked defective for the skip-column mode.

At step 358, an alternative configurable logic element is selected for processing. For the skip-single mode, the configurable logic element in the row above the defective configurable logic element is selected; for the skip-row mode, the configurable logic element in the row above the row containing the defective configurable logic element is selected; and for the skip-column mode, the configurable logic element in the column to the right of the column containing the defective configurable logic element is selected. Control is then directed back to step 354.

Once a non-defective source configurable logic element has been found, control is directed to decision step 360. The processing performed for sink configurable logic element(s) by steps 360, 362, and 364 is analogous to the processing performed at steps 354, 356, and 358 for the source configurable logic element. One distinction, however, is that a source configurable logic element may be connected to multiple sink configurable logic elements. Thus, for each sink configurable logic element under consideration, the test for defective configurable logic element, row, or column must be performed (depending on the skip-mode parameter). For each defective sink configurable logic element, the appropriate configurable logic element, row or column must be marked as defective (step 362), and an alternative configurable logic element, row, or column must be selected (step 364).

At step 366, the logic for the source configurable logic element is set by generating the bits for the configuration bitstream. The particular bits generated depend on the function to be performed by the source configurable logic element.

At step 368, the source configurable logic element is routed to one or more sink configurable logic elements. The route is accomplished, for example, using the techniques described in the application "RUN-TIME ROUTING FOR PROGRAMMABLE LOGIC DEVICES", by Keller. It will be appreciated that since the defective interconnects have been marked as "used", the routing process will automatically not consider the defective interconnects when generating a route.

At step 370, new source and sink configurable logic elements are selected for configuration. Decision step 372 tests whether configuration of the logic core is complete and returns control to decision step 354 if the logic core requires additional configurable logic elements. Otherwise, the process is complete for the logic core.

The present invention is believed to be applicable to a variety of systems for configuring PLDs and has been found to be particularly applicable for constructing runtime parameterizable logic cores for FPGAs. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for generating a configuration bitstream for a programmable logic device having a plurality of configurable logic elements and interconnect resources and one or more defective circuit elements in the configurable logic elements and interconnect resources, comprising:

identifying the configurable logic elements having the defective circuit elements;

executing a design program that includes executable code that specifies a circuit design and generates a configuration bitstream that implements the circuit design on the programmable logic device; and if a first configurable logic element has one or more defective circuit elements, the first configurable logic element being referenced in the design program for implementing a portion of the circuit design, selecting via code in the design program an alternative configurable logic element and generating bit values in the configuration bitstream for configuring the alternative configurable logic element to implement the portion of the circuit design.

2. The method of claim 1, further comprising:

constructing data objects associated with the configurable logic elements, respectively, wherein each data object includes an attribute that describes a status of the associated configurable logic element; and setting the attribute in the data object associated with the first configurable logic element to a value that indicates the configurable logic element is defective.

3. The method of claim 1, wherein the configurable logic elements of the programmable logic device are arranged in a matrix of rows and columns, further comprising:

if any of the configurable logic elements in the row occupied by the first configurable logic element have one or more defective circuit elements, bypassing configurable logic elements in the row occupied by the first configurable logic element in generating bit values in the configuration bitstream.

4. The method of claim 3, further comprising:

constructing data objects associated with the configurable logic elements, respectively, wherein each data object includes an attribute that describes a status of the associated configurable logic element; and setting the attributes in the data objects associated with configurable logic elements in the row occupied by the first configurable logic element to a value that indicates the configurable logic elements are defective.

5. The method of claim 1, wherein the configurable logic elements of the programmable logic device are arranged in a matrix of rows and columns, further comprising:

if any of the configurable logic elements in the column occupied by the first configurable logic element have one or more defective circuit elements, bypassing configurable logic elements in the column occupied by the first configurable logic element in generating bit values in the configuration bitstream.

6. The method of claim 5, further comprising:

constructing data objects associated with the configurable logic elements, respectively, wherein each data object includes an attribute that describes a status of the associated configurable logic element; and setting the attributes in the data objects associated with configurable logic elements in the column occupied by the first configurable logic element to a value that indicates the configurable logic elements are defective.

7. The method of claim 1, further comprising:

constructing data objects associated with the interconnect resources, respectively, wherein each data object includes an attribute that describes a status of the associated interconnect resource;

for each interconnect resource having a defective circuit element, setting the attribute in the associated data object to a value that indicates the interconnect resource is presently assigned and unavailable for additional connections; and generating via code in the design program bit values in the configuration bitstream for configuring interconnect resources that connect the one or more output pins of the first configurable logic element to one or more input pins of one or more other configurable logic elements.

8. The method of claim 7, further comprising:

constructing data objects associated with the configurable logic elements, respectively, wherein each data object includes an attribute that describes a status of the associated configurable logic element; and setting the attribute in the data object associated with the first configurable logic element to a value that indicates the configurable logic element is defective.

9. The method of claim 7, wherein the configurable logic elements of the programmable logic device are arranged in a matrix of rows and columns, further comprising:

if any of the configurable logic elements in the row occupied by the first configurable logic element have one or more defective circuit elements, bypassing configurable logic elements in the row occupied by the first configurable logic element in generating bit values in the configuration bitstream.

10. The method of claim 9, further comprising:

constructing data objects associated with the configurable logic elements, respectively, wherein each data object includes an attribute that describes a status of the associated configurable logic element; and setting the attributes in the data objects associated with configurable logic elements in the row occupied by the first configurable logic element to a value that indicates the configurable logic elements are defective.

11. The method of claim 7, wherein the configurable logic elements of the programmable logic device are arranged in a matrix of rows and columns, further comprising:

if any of the configurable logic elements in the column occupied by the first configurable logic element have one or more defective circuit elements, bypassing configurable logic elements in the column occupied by the first configurable logic element in generating bit values in the configuration bitstream.

12. The method of claim 11, further comprising:

constructing data objects associated with the configurable logic elements, respectively, wherein each data object includes an attribute that describes a status of the associated configurable logic element; and setting the attributes in the data objects associated with configurable logic elements in the column occupied by the first configurable logic element to a value that indicates the configurable logic elements are defective.

13. A method of generating a configuration bitstream for a programmable logic device having a plurality of configurable logic elements and interconnect resources and one or more defective circuit elements in the configurable logic elements and interconnect resources, comprising:

identifying the configurable logic elements having the defective circuit elements;

constructing data objects associated with the configurable logic elements, respectively, wherein each data object includes an attribute that describes a status of the associated configurable logic element;

executing a design program that includes executable code that specifies a circuit design and generates a configuration bitstream that implements the circuit design on the programmable logic device;

inputting a selected value for a skip-mode parameter to the design program;

if a first configurable logic element has a defective circuit element, the first configurable logic element being referenced in the design program for implementing a portion of the circuit design, selecting via code in the design program an alternative configurable logic element and generating bit values in the configuration bitstream for configuring the alternative configurable logic element to implement the portion of the circuit design;

responsive to the skip-mode parameter having a first value, setting the attribute in the data object associated with the first configurable logic element to a value that indicates the first configurable logic element is defective; and responsive to the skip-mode parameter having a second value, setting attributes in data objects associated with a selected group of configurable logic elements to a value that indicates the selected group of configurable logic element are defective.

14. The method of claim 13, wherein the configurable logic elements of the programmable logic device are arranged in a matrix of rows and columns, further comprising:

responsive to the skip-mode parameter having a second value, setting attributes in data objects associated with configurable logic elements in the row occupied by the first configurable logic element to a value that indicates the row of configurable logic element are defective; and responsive to the skip-mode parameter having a third value, setting attributes in data objects associated with configurable logic elements in the column occupied by the first configurable logic element to a value that indicates the column of configurable logic element are defective.

15. The method of claim 14, further comprising:

constructing data objects associated with the interconnect resources, respectively, wherein each data object includes an attribute that describes a status of the associated interconnect resource;

for each defective interconnect resource, setting the attribute in the associated data object to a value that indicates the interconnect resource is presently assigned and unavailable for additional connections; and generating via code in the design program bit values in the configuration bitstream for configuring interconnect resources that connect one or more output pins of the alternative configurable logic element to one or more input pins of one or more other configurable logic elements.

16. An apparatus for generating a configuration bitstream for a programmable logic device having a plurality of configurable logic elements and interconnect resources and one or more defective circuit elements in the configurable logic elements and interconnect resources, comprising:

means for identifying the configurable logic elements having the defective circuit elements;

means for executing a design program that includes executable code that specifies a circuit design and generates a configuration bitstream that implements the circuit design on the programmable logic device; and means for selecting an alternative configurable logic element to a first configurable logic element and generating bit values in the configuration bitstream for configuring the alternative configurable logic element to implement a portion of the circuit design if the first configurable logic element has a defective circuit element, the first configurable logic element being referenced in the design program for implementing the portion of the circuit design.

* * * * *